United States Patent
Kim

(10) Patent No.: US 8,933,470 B2
(45) Date of Patent: Jan. 13, 2015

(54) DISPLAY APPARATUS HAVING A PLURALITY OF STACKED ORGANIC AND INORGANIC LAYERS AND METHOD OF MANUFACTURING THE SAME

(71) Applicant: Samsung Display Co., Ltd., Yongin, Gyeonggi-Do (KR)

(72) Inventor: Seon-Hee Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/910,070

(22) Filed: Jun. 4, 2013

(65) Prior Publication Data

US 2014/0197427 A1    Jul. 17, 2014

(30) Foreign Application Priority Data

Jan. 11, 2013    (KR) .......................... 10-2013-0003509

(51) Int. Cl.
| | |
|---|---|
| *H01L 29/18* | (2006.01) |
| *H01L 29/15* | (2006.01) |
| *H01L 23/29* | (2006.01) |
| *B32B 9/00* | (2006.01) |
| *H01L 33/56* | (2010.01) |
| *H01L 51/00* | (2006.01) |
| *H01L 51/52* | (2006.01) |

(52) U.S. Cl.
CPC ............ *H01L 33/56* (2013.01); *H01L 51/0097* (2013.01); *H01L 51/5253* (2013.01); *H01L 2251/5338* (2013.01)
USPC ................ 257/88; 257/72; 257/790; 428/690

(58) Field of Classification Search
CPC ... H01L 25/0753; H01L 33/62; H01L 27/153; H01L 33/20; F21K 9/00
USPC .............................. 257/88, 72, 790; 428/690
See application file for complete search history.

(56) References Cited

U.S. PATENT DOCUMENTS

| | | | |
|---|---|---|---|
| 6,867,539 B1 * | 3/2005 | McCormick et al. ......... 313/504 |
| 2003/0206332 A1 * | 11/2003 | Yamazaki et al. ............ 359/312 |
| 2004/0247949 A1 * | 12/2004 | Akedo et al. .................. 428/704 |
| 2005/0127371 A1 * | 6/2005 | Yamazaki et al. .............. 257/72 |
| 2007/0196682 A1 * | 8/2007 | Visser et al. .................. 428/594 |
| 2007/0210459 A1 * | 9/2007 | Burrows et al. ............... 257/790 |
| 2007/0273280 A1 * | 11/2007 | Kim et al. ..................... 313/509 |

(Continued)

FOREIGN PATENT DOCUMENTS

| | | |
|---|---|---|
| KR | 10-2011-0018668 A | 2/2011 |
| KR | 10-2011-0064206 A | 6/2011 |

(Continued)

*Primary Examiner* — Long K Tran
*Assistant Examiner* — Dzung Tran
(74) *Attorney, Agent, or Firm* — Christie, Parker & Hale, LLP

(57) ABSTRACT

A display apparatus and a method of manufacturing the same includes a substrate including a plurality of organic layers and a plurality of inorganic layers, a display unit formed on the substrate and an encapsulation unit formed on the display, wherein the plurality of organic layers and the plurality of inorganic layers comprise at least a first organic layer, a first inorganic layer, a second organic layer, and a second inorganic layer which are sequentially stacked, and wherein an interfacial adhesion strength of the second organic layer is higher than an interfacial adhesion strength of the first organic layer.

20 Claims, 6 Drawing Sheets

(56) References Cited

U.S. PATENT DOCUMENTS

2008/0057251 A1* 3/2008 Griswold et al. ............ 428/40.1
2008/0305360 A1* 12/2008 Han et al. ...................... 428/690
2011/0140164 A1 6/2011 Seo et al.
2012/0001534 A1 1/2012 Kim

FOREIGN PATENT DOCUMENTS

KR 10-1097321 B1 12/2011
KR 10-2012-0003664 A 1/2012

* cited by examiner

DISPLAY APPARATUS HAVING A PLURALITY OF STACKED ORGANIC AND INORGANIC LAYERS AND METHOD OF MANUFACTURING THE SAME

CROSS-REFERENCE TO RELATED PATENT APPLICATION

This application claims priority to and the benefit of Korean Patent Application No. 10-2013-0003509, filed on Jan. 11, 2013, in the Korean Intellectual Property Office, the disclosure of which is incorporated herein in its entirety by reference.

BACKGROUND

1. Field

One or more aspects of the present invention relate to a display apparatus and a method of manufacturing the same.

2. Description of the Related Art

Recently, the use of a display apparatus for various purposes has increased. That is, the display apparatus is now widely used because its thickness has become thinner and its weight has become lighter.

In order to use the display apparatus more widely, a substrate of the display apparatus, formed of a flexible organic or inorganic material, has been proposed for use instead of using a rigid glass substrate. Especially, in a case of a portable thin flat-panel display apparatus or a flexible display apparatus which may be bent or folded by a user when desired, such a flexible substrate may be very useful.

However, the substrate, having such a flexibility, may not be easily handled, compared to a substrate formed of glass or a rigid material. Furthermore, a degeneration or defect may frequently occur in the flexible substrate, during a process of manufacturing or using the flexible substrate.

As a result, there is a limit on improving a durability of the display apparatus.

SUMMARY

One or more aspects of embodiments of the present invention are directed toward a display apparatus with improved durability and a method of manufacturing the same.

According to an embodiment of the present invention, there is provided a display apparatus including a substrate including a plurality of organic layers and a plurality of inorganic layers; a display unit formed on the substrate; and an encapsulation unit formed on the display, wherein the plurality of organic layers and the plurality of inorganic layers include at least a first organic layer, a first inorganic layer, a second organic layer, and a second inorganic layer that are sequentially stacked, and wherein an interfacial adhesion strength of the second organic layer is higher than an interfacial adhesion strength of the first organic layer.

The second organic layer may include a first member and a second member.

The first member may contain a polymer material.

The first member may contain polyimide (PI).

The second member may contain a reactive silicone material which includes a material in an epoxy group and silicone.

The first and second members are mixed together in a region including a surface of the second organic layer that faces the display unit.

The first and second members may be formed of the same material and have a different height from each other.

The first and second members may not be formed as one body and are formed to be separated from each other.

An upper surface of the first and second members may contact the second inorganic layer.

An upper surface of the second organic layer, which includes the first and second members, may be formed to have an embossed surface.

The encapsulation unit includes one or more organic or inorganic layers.

The display apparatus may further include a sealing member that bonds the substrate and the encapsulation unit to each other.

The display unit may include a first electrode, a second electrode, and an intermediate layer, which is disposed between the first electrode and the second electrode and includes an emissive layer.

The display apparatus may further include a thin-film transistor (TFT) that is electrically connected to the first electrode and includes an active layer, a gate electrode, a source electrode, and a drain electrode.

According to another embodiment of the present invention, there is provided a method of manufacturing a display apparatus, the method including preparing a substrate including a plurality of organic layers and a plurality of inorganic layers; forming a display unit on the substrate; and forming an encapsulation unit on the display unit, wherein the plurality of organic layers and the plurality of inorganic layers include at least a first organic layer, a first inorganic layer, a second organic layer, and a second inorganic layer that are sequentially stacked, and wherein an interfacial adhesion strength of the second organic layer is higher than an interfacial adhesion strength of the first organic layer.

The second organic layer may be formed to include a first member and a second member.

The forming of the second organic layer may include adding a reactive silicone, which includes a material in an epoxy group and silicone to form the second member, to a polymer material to form the first member, and applying, and then, hardening the polymer material with the reactive silicone added to the polymer material on the first inorganic layer.

The first member and the second member may be formed to have the same height and by using the same material.

The first member and the second member may be formed by using an ink-jet printing method or an offset printing method.

The preparing of the substrate may include disposing the substrate to the base member which is larger than or at least of the same size as the substrate, and the base member may be removed before the display apparatus is manufactured.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
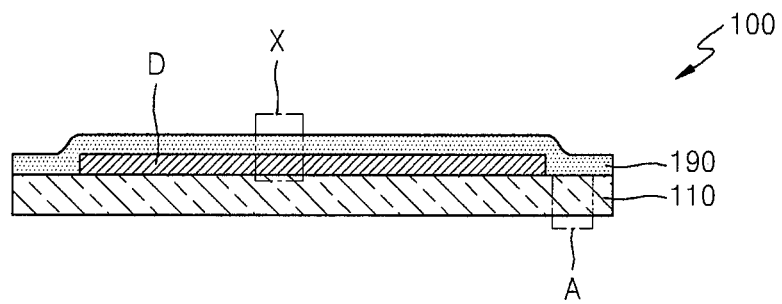
FIG. 1 is a schematic cross-sectional view illustrating a display apparatus according to an embodiment of the present invention.

The invention may be embodied in many different forms and should not be construed as being limited to the embodiments set forth herein. In the drawing, the sizes and thicknesses of constituent elements are arbitrarily illustrated for convenience of description, and the present invention is not necessarily limited to the illustrations provided herein.

In the drawings, the thickness of several layers and areas is magnified for clarity of illustration, and the thickness of some layers and areas is exaggerated for explanatory convenience purposes. It will be understood that when an element such as a layer, film, region, or substrate is referred to as being "on" another element, it can be directly on the other element or intervening element(s) may be present therebetween.

It will be further understood that the terms "comprises," "comprising," "includes," and/or "including," when used throughout the description, specify the presence of components, but do not preclude the presence or addition of one or more other components, unless otherwise specified. Additionally, when an element is referred to as being "on" another element, it can be placed on or below the other element, and it does not necessarily mean that the element is on the other element in a direction of gravity.

The present invention will now be described more fully with reference to the accompanying drawings, in which exemplary embodiments of the invention are shown.

Figure 2:
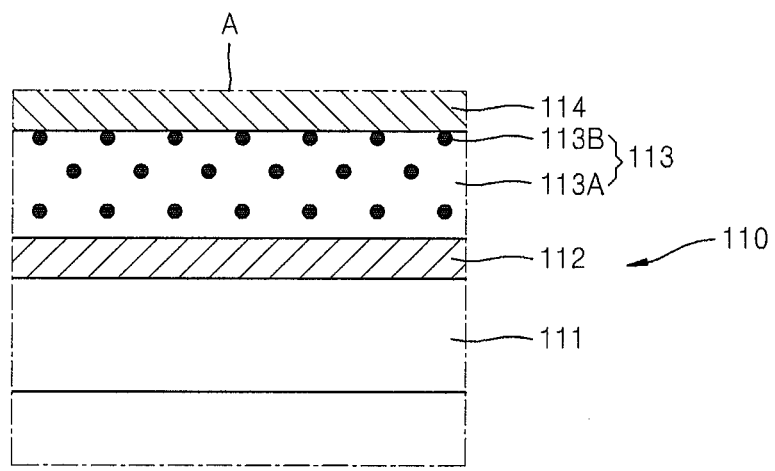
FIG. 2 is a magnifying view of a region A shown in FIG. 1.

FIG. 1 is a schematic cross-sectional view of a display apparatus according to an embodiment of the present invention. FIG. 2 is a magnifying view of a region A shown in FIG. 1, and FIG. 3 is a magnifying view of a region X shown in FIG. 1.

Figure 3:
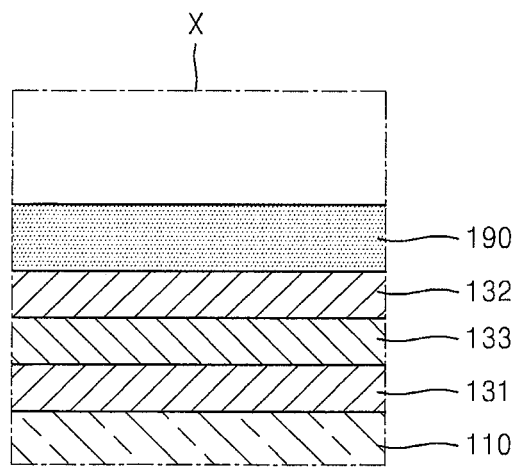
FIG. 3 is a magnifying view of a region X shown in FIG. 1.

Referring to FIGS. 1 through 3, the display apparatus 100 includes a substrate 110, a display unit D, and an encapsulation unit 190.

The display unit D may include various suitable display elements such as a liquid crystal element or an organic light-emitting element, and this will be described later.

The substrate 110 includes a plurality of organic layers 111 and 113, and a plurality of inorganic layers 112 and 114. The plurality of organic layers 111 and 113 include a first organic layer 111 and a second organic layer 113. The plurality of inorganic layers 112 and 114 include a first inorganic layer 112 and a second inorganic layer 114.

Specifically, the first inorganic layer 112 is formed on the first organic layer 111, and the second organic layer 113 is disposed on the first inorganic layer 112. The second inorganic layer 114 is disposed on the second organic layer 113.

The first organic layer 111 may include various suitable organic materials, e.g., a polymer material. For example, desirably, the first organic layer 111 may contain polyimide (PI).

The first inorganic layer 112 is formed on the first organic layer 111. The first inorganic layer 112 may be formed of various suitable inorganic materials. For example, the first inorganic layer 112 may contain a silicon nitride, an aluminium nitride, a zirconium nitride, a titanium nitride, a hafnium nitride, a tantalum nitride, a silicon oxide, an aluminium oxide, a titanium oxide, a tin oxide, a cerium oxide, and/or a silicon oxynitride (SiON). Additionally, the first inorganic layer 112 may be formed by using various suitable methods, such as a vacuum film forming method like sputtering, chemical vapor deposition (CVD), e-beam evaporation, thermal evaporation, or thermal ion beam-assisted deposition (IBAD).

The first inorganic layer 112 is formed to be adjacent to the first organic layer 111 which is susceptible (fragile) to moisture, so as to function as a barrier layer.

The second organic layer 113 is formed on the first inorganic layer 112. The second organic layer 113 includes a first member 113A and a second member 113B. The first and second members 113A and 113B have different characteristics from each other. That is, the first and second members 113A and 113B contain different materials from each other.

The first member 113A in the second organic layer 113 may contain an organic material, especially, a polymer material. For example, desirably, the first member 113A may contain polyimide (PI).

The second member 113B in the second organic layer 113 contains at least a reactive silicone material. Specifically, the second member 113B contains a reactive silicone material which contains silicone and a material in an epoxy group.

The first member 113A corresponds to a base material of the second organic layer 113. That is, the first member 113A takes a larger portion of the second organic layer 113 than the second member 113B does. Additionally, the first member 113A and the second member 113B may be mixed with each other, at least in a region of the second organic layer 113. Especially, a surface of the organic layer 113 may include a region in which the first and second members 113A and 113B are mixed with each other so that an interfacial adhesion strength of the second organic layer 113 may improve. That is, the interfacial adhesion strength of the second organic layer 113 has a higher value than an interfacial adhesion strength of the first organic layer 111.

As a result, an interfacial adhesion strength between the second organic layer 113 and the second inorganic layer 114 is higher than an interfacial adhesion strength between the first organic layer 111 and the first inorganic layer 112.

As described above, because the first member 113A in the second organic layer 113 contains a polymer material such as PI, adhesion strength between the first member 113A and adjacent layers may decrease. On the contrary, because the second member 113B contains a reactive silicone material, adhesion strength of the second organic layer 113, that is, adhesion between the second organic layer 113 and an adjacent layer may improve. That is, the second organic layer 113 is stably adhered to the first inorganic layer 112 therebelow.

The second organic layer 113 may be formed by using various suitable methods. The second organic layer 113 may be formed by adding a material for forming the second member 113B, that is, a reactive silicone material, which contains a material in an epoxy group and silicone for forming the second member, to a liquid material which contains PI for forming the first member 113A, and applying and hardening the polymer material with the reactive silicone added to the polymer material, on the first inorganic layer 112.

The second inorganic layer 114 is formed on the second organic layer 113. Like the first inorganic layer 112, the second inorganic layer 114 may be formed of various suitable inorganic materials. For example, the first inorganic layer 114 may contain a silicon nitride, an aluminium nitride, a zirconium nitride, a titanium nitride, a hafnium nitride, a tantalum nitride, a silicon oxide, an aluminium oxide, a titanium oxide, a tin oxide, a cerium oxide, and/or a silicon oxynitride (SiON). The second inorganic layer 114 may be formed of the same material as the first inorganic layer 112, or formed of a different material from the first inorganic layer 112.

Additionally, the second inorganic layer 114 may be formed by using various suitable methods, such as a vacuum film forming method like sputtering, CVD, e-beam evaporation, thermal evaporation, or IBAD.

The second inorganic layer 114 is formed to be adjacent to the second organic layer 113 which is susceptible (fragile) to moisture, so as to function as a barrier layer.

The second inorganic layer 114 contacts the second organic layer 113. As described above, since the second organic layer 113 includes the second member 113B, adhesion between the second organic layer 113 and an adjacent layer improves. Thus, adhesion between the second inorganic layer 114 and the second organic layer 113 improves.

As a result, the second inorganic layer 114 is not stripped (peeled of) from the second organic layer 113, and is stably maintained.

Though not illustrated, an organic or inorganic layer may be additionally stacked on the second inorganic layer 114.

The display unit D and the encapsulation unit 190 are formed on the substrate 110. Hereinafter, this is described in more detail.

The display unit D includes a first electrode 131, an intermediate layer 133, and a second electrode 132, so as to emit at least a visible light ray.

The first electrode 131 may function as an anode, and the second electrode 132 may function as a cathode, or vice versa. If the first electrode 131 functions as an anode, the first electrode 131 may include indium tin oxide (ITO), indium zinc oxide (IZO), zinc oxide (ZnO), and/or indium oxide ($In_2O_3$) which have a high work function. Additionally, the first electrode 131 may further include a reflective layer which is formed of silver (Ag), magnesium (Mg), aluminum (Al), platinum (Pt), palladium (Pd), gold (Au), nickel (Ni), neodymium (Nd), iridium (Ir), chrome (Cr), lithium (Li), ytterbium (Yb), and/or calcium (Ca).

The intermediate layer 133 includes an emissive layer (EML). Additionally, the intermediate layer 133 may include at least one or more layers selected from among a hole injection layer (HIL), a hole transport layer (HTL), an electron transport layer (ETL), and an electron injection layer (EIL).

If the second electrode 132 functions as a cathode, the second electrode 132 may be formed of metal such as Ag, Mg, Al, Pt, Pd, Au, Ni, Nd, Ir, Cr, Li, or Ca. Additionally, the second electrode 132 may include ITO, IZO, ZnO, and/or $In_2O_3$ so as to allow light transmission.

When a voltage is applied to the intermediate layer 133 via the first and second electrodes 131 and 132, a visible ray may be emitted from the emissive layer in the intermediate layer 133, so as to display an image.

In the current embodiment, a structure of the display unit D, which employs an organic-emitting element which includes an emissive layer, is described. However, the present invention is not limited thereto. That is, the display unit D may include various display elements such as a liquid-crystal element.

The encapsulation unit 190 is formed to encapsulate the display unit D. Desirably, the encapsulation unit 190 may be formed to contact an upper surface of the substrate 110.

Specifically, the encapsulation unit 190 is formed on the second electrode 132. Though not illustrated, one or more insulating or functional layers may be further disposed between the encapsulation unit 190 and the second electrode 132.

The encapsulation unit 190 may be formed of an organic or inorganic layer. Additionally, the encapsulation unit 190 may be formed by alternating one or more organic layers and one or more inorganic layers.

The display apparatus 100, in the present invention, includes the substrate 110, and the substrate 110 includes the first organic layer 111, the first inorganic layer 112, the second organic layer 113, and the second inorganic layer 114. The second organic layer 113 includes the first member 113A and the second member 113B. The first member 113A contains an organic material, especially, a polymer material. For example, desirably, the first member 113A may contain polyimide (PI). The second member 113B in the second organic layer 113 contains at least a reactive silicone material. Specifically, the second member 113B contains a reactive silicone material which contains silicone and a material in an epoxy group. Since the second organic layer 113 contains the second member 113B, adhesive strength of the second organic layer 113 improves. As a result, adhesive strength between the second organic layer 113 and the first inorganic layer 112, and adhesive strength between the second organic layer 113 and the second inorganic layer 114 improves. Thus, a durability of the second organic layer 113, the first inorganic layer 112, and the second inorganic layer 114 improves.

Additionally, the second member 113B relieves an internal stress in the second organic layer 113, thus effectively preventing cracking or stripping on a surface of the second organic layer 113.

Additionally, the display apparatus 100, in the current embodiment, includes a structure formed by stacking the first organic layer 111, the second organic layer 113, the first inorganic layer 112, and the second inorganic layer 114. Thus, the display apparatus 100 may be applied as a flexible display apparatus, which may be bent or folded. Especially, since the durability of the display apparatus is improved through the second organic layer 113, the display apparatus 100 may be effectively (easily) used as a flexible display apparatus.

Additionally, the display apparatus 100, in the current embodiment, uses the encapsulation unit 190 which includes an organic or inorganic layer, thus enhancing flexibility of the display apparatus 100.

The display unit D, described above, may include various modified embodiments. Hereinafter, this will be described.

Figure 4:
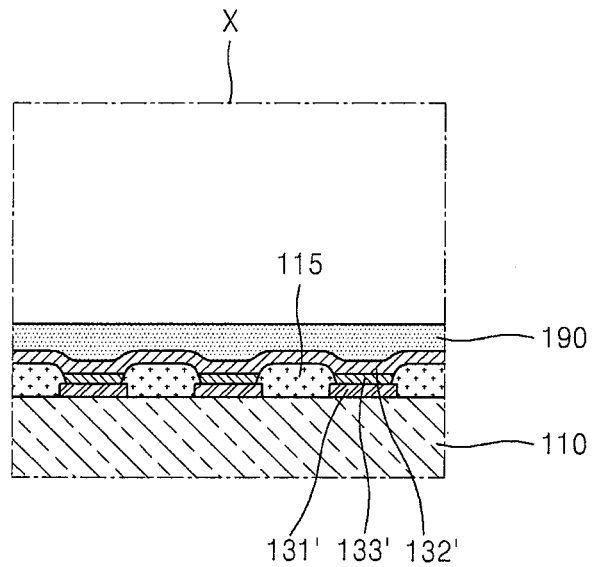
FIG. 4 is a schematic cross-sectional view illustrating a modified embodiment of a display unit of FIG. 1.

FIG. 4 is a schematic cross-sectional view illustrating a modified embodiment of the display unit of FIG. 1.

Referring to FIG. 4, the display unit D may include a first electrode 131', an intermediate layer 133' and a second electrode 132', so as to emit at least a visible light ray.

Specifically, the first electrode 131' is formed on the substrate 110. A pixel-defining layer 115 is formed on the first electrode 131' so as to expose a set or predetermined area of the first electrode 131'.

The intermediate layer 133' is formed on the first electrode 131' to contact the first electrode 131'.

The second electrode 132' is formed on the intermediate layer 133'.

The first electrode 131' may function as an anode, and the second electrode 132' may function as a cathode, or vice versa. The intermediate layer 133' includes an EML which emits a visible ray. Additionally, the intermediate layer 133' may include at least one or more layers selected from among a HIL, a HTL, an ETL, and an EIL.

A material which forms the first electrode 131', the second electrode 132', and the intermediate layer 133' is the same as in the embodiment described above. Thus, detailed description thereof will not be provided.

The encapsulation unit 190, as described above, is formed to encapsulate the display unit D. Desirably, the encapsulation unit 190 may be formed to contact an upper surface of the substrate 110. The encapsulation unit 190 is also formed on the second electrode 132'. Though not illustrated, one or more insulating or functional layers may be further disposed between the encapsulation unit 190 and the second electrode 132'.

Figure 5:
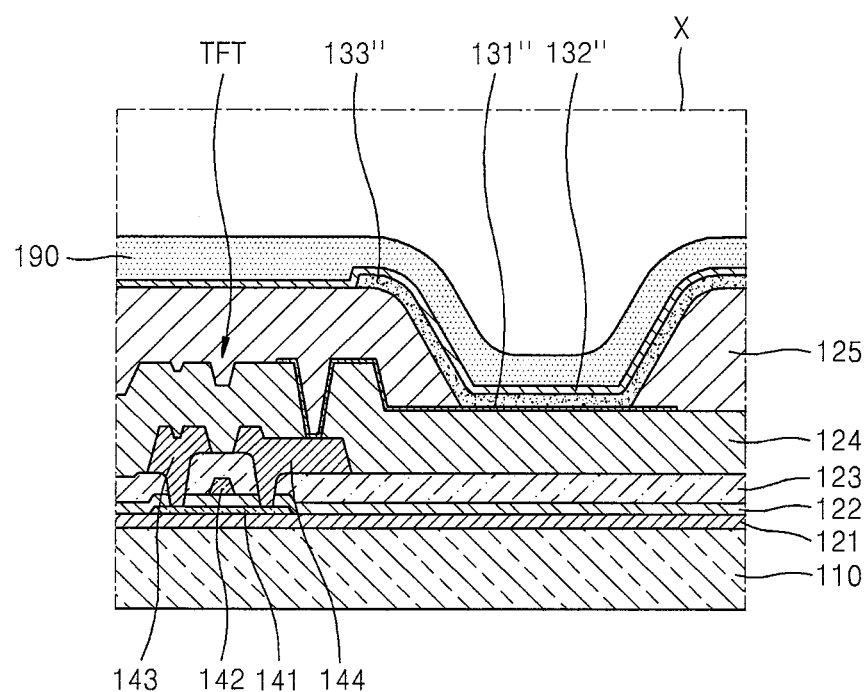
FIG. 5 is a schematic cross-sectional view illustrating another modified embodiment of the display unit of FIG. 1.

FIG. 5 is a schematic cross-sectional view illustrating another modified embodiment of the display unit of FIG. 1.

Referring to FIG. 5, the display unit D includes a first electrode 131", an intermediate layer 133", and a second electrode 132", so as to emit at least a visible light ray. The display unit D also includes a thin-film transistor (TFT).

The TFT includes an active layer 141, a gate electrode 142, a source electrode 143, and a drain electrode 144.

Hereinafter, detailed description will be provided.

A buffer layer 121 is formed on the substrate 110. An active layer 141, having a set or predetermined pattern, is formed on the buffer layer 121. The active layer 141 may be formed of a silicone-based inorganic semiconductor, an organic semiconductor, or an oxide semiconductor. The active layer 141 includes a source area, a drain area, and a channel area.

A gate insulating layer 122 is formed on the active layer 141, and a gate electrode 142 is formed on a set or predetermined area of the gate insulating layer 122. The gate insulating layer 122 functions to insulate the active layer 141 from the gate electrode 142. The gate insulating layer may be formed of an inorganic material such as silicon nitride ($SiN_x$) or silicon dioxide ($SiO_2$).

The gate electrode 142 may contain Au, Ag, Cu, Ni, Pt, Pd, Al, Mo, or a metal alloy such as an aluminum-neodymium (Al:Nd) alloy, or a molybdenum tungsten (Mo:W) alloy. However, the gate electrode 142 is not limited thereto, and may be formed of various suitable materials by considering adhesion to an adjacent layer, planarizability, electrical resistance, and fabricability.

An interlayer insulating layer 123 is formed on the gate electrode 142. The interlayer insulating layer 123 and the gate insulating layer 122 are formed to expose the source and drain areas of the active layer 141. The source electrode 143 and the drain electrode 144 are formed to contact the exposed source and drain areas on the active layer 141.

The source electrode 143 and the drain electrode 144 may be formed of various conductive materials, and may have a single-layered or multi-layered structure.

A passivation layer 124 is formed on the TFT. Specifically, the passivation layer 124 is formed on the source electrode 143 and the drain electrode 144.

The passivation layer 124 is formed to expose a set or predetermined area of the drain electrode 144, not to cover an entire surface of the drain electrode 144. A first electrode 131" is formed to be connected to the exposed drain electrode 144.

A pixel-defining layer 125 is formed on the first electrode 131" as an insulating material. The pixel-defining layer 125 is formed to expose a set or predetermined area of the first electrode 131".

The intermediate layer 133" is formed to contact the exposed first electrode 131". The second electrode 132" is formed to be connected to the intermediate layer 133".

The encapsulation unit 190 is formed on the second electrode 132".

Figure 6:
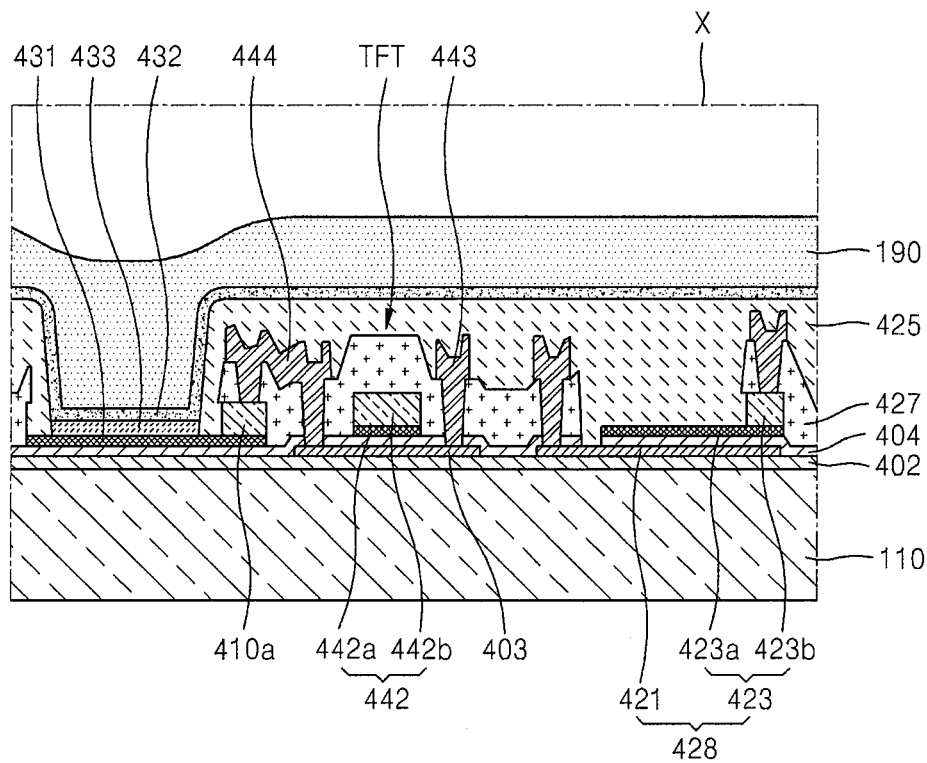
FIG. 6 is a schematic cross-sectional view illustrating another modified embodiment of the display unit of FIG. 1.

FIG. 6 is a schematic cross-sectional view illustrating another modified embodiment of the display unit of FIG. 1.

Referring to FIG. 6, the display unit D includes a first electrode 431, an intermediate layer 433, and a second electrode 432, so as to emit at least a visible light ray. The display unit D also includes a thin-film transistor (TFT).

The TFT includes an active layer 403, a gate electrode 442, a source electrode 443, and a drain electrode 444.

Hereinafter, detailed description is provided.

A buffer layer 402 is formed on the substrate 110. An active layer 403, having a set or predetermined pattern, is formed on the buffer layer 402. A first capacitor electrode 421 is formed on the buffer layer 402. Desirably, the first capacitor electrode 421 may be formed of the same material as the active layer 403.

A gate insulating layer 404 is formed on the buffer layer 402, so as to cover the active layer 403 and the first capacitor electrode 421.

The gate electrode 442, the first electrode 431, and a second capacitor electrode 423 are formed on the gate insulating layer 406.

The gate electrode 442 includes a first conductive layer 442a and a second conductive layer 442b.

The first electrode 431 may be formed of the same material as the first conductive layer 442a. A conductive unit 410a is disposed on a set or predetermined area on the first electrode 431. The conductive unit 410a is formed of the same materials as the second conductive layer 442b.

The second capacitor electrode 423 includes a first layer 423a and a second layer 423b. The first layer 423a is formed of the same material as the first conductive layer 442a, and the second layer 423b is formed of the same material as the second conductive layer 442b. The second layer 423b is formed on the first layer 423a, to have a smaller size than the first layer 423a. Additionally, the second capacitor electrode 423 is formed to overlap with the first capacitor electrode 421 and to have a smaller size than the first capacitor electrode 421.

An interlayer insulating layer 427 is formed on the first electrode 431, the gate electrode 442, and the second capacitor electrode 423. A source electrode 443 and a drain electrode 444 are formed on the interlayer insulating layer 427. The source electrode 443 and the drain electrode 444 are formed to be connected to the active layer 403.

Additionally, either of the source electrode 443 or the drain electrode 444 is electrically connected to the first electrode 431. In FIG. 6, the drain electrode 444, electrically connected to the first electrode 431, is illustrated. Specifically, the drain electrode 444 contacts the conductive unit 410a.

A pixel-defining layer 425 is formed on the interlayer insulating layer 427 to cover the source electrode 443, the drain electrode 444, and a capacitor 428.

The pixel-defining layer 425 is formed not to cover a set or predetermined area on the first electrode 431, and an intermediate layer 433 is formed to contact an exposed area on a surface of the first electrode 431.

A second electrode 432 is formed on the intermediate layer 433.

The encapsulation unit 190 is formed on the second electrode 432.

Figure 7:
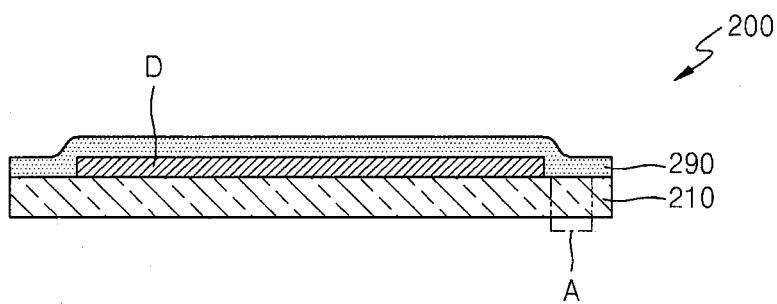
FIG. 7 is a schematic cross-sectional view illustrating a display apparatus according to another embodiment of the present invention.
Figure 8:
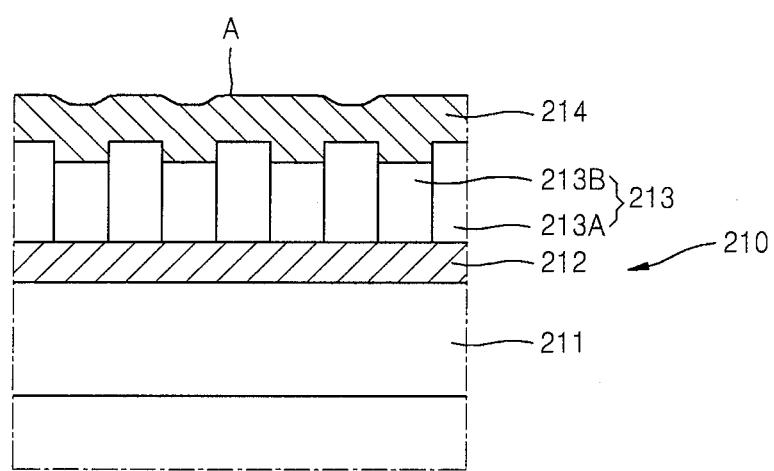
FIG. 8 is a magnifying view of a region A shown in FIG. 7.

FIG. 7 is a schematic cross-sectional view illustrating a display apparatus according to another embodiment of the present invention, and FIG. 8 is a magnifying view of a region A shown in FIG. 7.

Referring to FIGS. 7 and 8, a display apparatus 200 includes a substrate 210, the display unit D, and an encapsulation unit 290.

One of the structures shown in FIGS. 3 through 6, described above, may be applied to the display unit D. The display unit D may also include various suitable display elements such as a liquid-crystal element.

The substrate 210 includes a plurality of organic layers 211 and 213, and a plurality of inorganic layers 212 and 214. The plurality of organic layers 211 and 213 include a first organic layer 211 and a second organic layer 213. The plurality of inorganic layers 212 and 214 include a first inorganic layer 212 and a second inorganic layer 214.

Specifically, the first inorganic layer 212 is formed on the first organic layer 211, and the second organic layer 213 is disposed on the first inorganic layer 212. The second inorganic layer 214 is disposed on the second organic layer 213.

The first organic layer 211 may include various suitable organic materials, especially, a polymer material. For example, desirably, the first organic layer 111 may contain polyimide (PI).

The first inorganic layer 212 is formed on the first organic layer 211. The first inorganic layer 212 may be formed of various suitable inorganic materials. For example, the first inorganic layer 212 may contain a silicon nitride, an aluminium nitride, a zirconium nitride, a titanium nitride, a hafnium nitride, a tantalum nitride, a silicon oxide, an aluminium oxide, a titanium oxide, a tin oxide, a cerium oxide, and/or a silicon oxynitride (SiON). Additionally, the first inorganic layer 212 may be formed by using various suitable methods, such as a vacuum film-forming method like sputtering, chemical vapor deposition (CVD), e-beam evaporation, thermal evaporation, or thermal ion beam-assisted deposition (IBAD).

The first inorganic layer 212 is formed to be adjacent to the first organic layer 211 which is susceptible (fragile) to moisture, so as to function as a barrier layer.

The second organic layer 213 is formed on the first organic layer 212. The second organic layer 213 includes a first member 213A and a second member 213B. The first and second members 213A and 213B have different characteristics from each other. That is, the first and second members 213A and 213B have different forms from each other.

Desirably, the first member 213A and the second member 213B in the second organic layer 213 may have a different height from each other. Also desirably, the second organic layer 213 may include a plurality of the first members 213A and a plurality of the second members 213B.

The second organic layer 213 is formed to include the plurality of first members 213A and the plurality of second members 213B which are separate from each other and not formed as one body. Therefore, a stress on the second organic layer 213 is effectively distributed, and thus, deformation of the second organic layer 213 may be prevented.

Especially, the second organic layer 213 contains an organic material, especially, a polymer material. For example, desirably, the second organic layer 213 may contain polyimide (PI). The second organic layer 213 may be formed by applying and hardening a PI-based liquid material. In a process of the hardening, a stress on the second organic layer 213 is effectively distributed, and thus, the second organic layer 213 may be formed to have a desired form. Additionally, when the second organic layer 213 is formed, the second organic layer 213 may shrink, in a process of applying and hardening a liquid material, and thus, may become stripped from the adjacent first inorganic layer 212. Therefore, in the current embodiment, the second organic layer 213 is formed to separate into the first member 213A and the second member 213B. Thus, when the second organic layer 213 shrinks, a stress is distributed and adhesion between the second organic layer 213 and the first inorganic layer 212 improves. Accordingly, stripping of the second organic layer 213 from the first inorganic layer 212 may be effectively prevented. That is, an interfacial adhesion strength of the second organic layer 213 is higher than an interfacial adhesion strength of the first organic layer 211.

Additionally, the first member 213A and the second member 213B are formed to have a different height from each other so that an upper surface of the second organic layer 213 may be formed to have an embossed surface. Therefore, an adhesion area between the second organic layer 213 and the second inorganic layer 214 increases, thus improving adhesion therebetween.

FIG. 8 shows an alternation of the first member 213A and the second member 213B with each other. However, the present invention is not limited thereto. That is, the first member 213A and the second member 213B may be disposed in various suitable forms so that an upper surface of the second organic layer 213 may be embossed. Specifically, the second organic layer 213 may include at least two of the first members 213A which are adjacently disposed, from among a plurality of the first members 213A. The second organic layer 213 may also include at least two of the second members 213B which are adjacently disposed, from among a plurality of the second members 213B.

A method of forming the second organic layer 213 may vary. For example, the second organic layer 213 including a plurality of the first members 213A and the second members 213B may be formed by using an ink-jet printing method or an offset printing method.

The second inorganic layer 214 is formed on the second organic layer 213. Like the first inorganic layer 212, the second inorganic layer 214 may be formed of various suitable inorganic materials. For example, the second inorganic layer 214 may contain a silicon nitride, an aluminium nitride, a zirconium nitride, a titanium nitride, a hafnium nitride, a tantalum nitride, a silicon oxide, an aluminium oxide, a titanium oxide, a tin oxide, a cerium oxide, and/or a silicon oxynitride (SiON). The second inorganic layer 214 may be formed of the same material as the first inorganic layer 212, or may be formed of a different material from the first inorganic layer 212.

Additionally, the second inorganic layer 214 may be formed by using various methods, such as a vacuum film forming method like sputtering, CVD, e-beam evaporation, thermal evaporation, or IBAD.

The second inorganic layer 214 is formed to be adjacent to the second organic layer 213 which is susceptible (fragile) to moisture, so as to function as a barrier layer.

The second inorganic layer 214 contacts the second organic layer 213. As described above, since the second organic layer 213 is formed to have an embossed upper surface by using the first member 213A and the second member 213B, adhesion strength between the second organic layer 213 and an adjacent layer improves. Thus, adhesion strength between the second inorganic layer 214 and the second organic layer 213 improves.

As a result, the second inorganic layer 214 is not stripped from the second organic layer 213, and is stably maintained.

The display unit D and the encapsulation unit 190 are formed on the substrate 210. Description about the display unit D and the encapsulation unit 290 is the same as in the embodiments described above. Thus, detailed description will not be provided.

The display apparatus 200 in the current embodiment includes the substrate 210. The substrate 210 includes the first organic layer 211, the first inorganic layer 212, the second organic layer 213, and the second inorganic layer 214. The second organic layer 213 includes the first member 213A and the second member 213B. The first member 213A and the second member 213B have a different height from each other.

The second organic layer 213 is formed to include the plurality of first members 213A and the plurality of second members 213B which are separated from each other and are not formed as one body. Therefore, a stress on the second organic layer 213 is effectively distributed, and thus, a durability of the second organic layer 213 may improve.

Additionally, the second organic layer 213 is formed to have an embossed upper surface, and thus, adhesion strength between the second organic layer 213 and the second inorganic layer 214 may improve.

Additionally, the display apparatus 200, in the current embodiment, includes the substrate 210 which is formed by stacking the first organic layer 211, the second organic layer 213, the first inorganic layer 212, and the second inorganic layer 214. Thus, the display apparatus 100, which may be bent or folded, may be applied as a flexible display apparatus. Especially, because a durability improves through the second organic layer 113, the display apparatus 100 may be effectively (easily) used as a flexible display apparatus.

Figure 9:
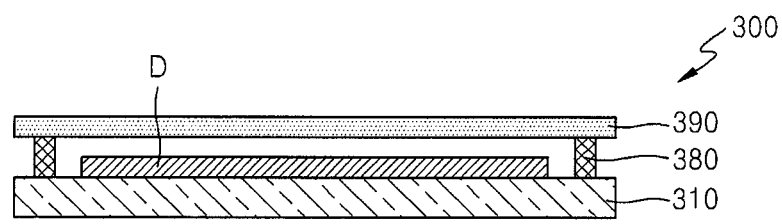
FIG. 9 is a schematic cross-sectional view illustrating a display apparatus according to another embodiment of the present invention.

FIG. 9 is a schematic cross-sectional view illustrating a display apparatus according to another embodiment of the present invention.

The display apparatus 300 includes a substrate 310, the display unit D, an encapsulation unit 390, and a sealing member 380.

The substrate 310, though not illustrated, includes at least a first organic layer, a first inorganic layer, a second organic layer, and a second inorganic layer.

Additionally, the second organic layer (not illustrated) includes a first member (not illustrated) and a second member (not illustrated). A detailed structure of the substrate 310 may be the same as a structure of the substrate 110 of FIG. 1 or the substrate 210 of FIG. 7, which are described above.

The display unit D may include various suitable display elements. For example, one of the structures shown in FIGS. 3 through 8 may be applied as the display unit D.

The encapsulation unit 390 is disposed on the display unit D to face the substrate 310. The encapsulation unit 390 may include glass or other suitable materials. Additionally, the encapsulation unit 390 may be formed of a metal or plastic material, or an organic or inorganic material.

The encapsulation unit 390 and the substrate 310 are bonded together by using the sealing member 380.

Like the embodiment described above, the display apparatus 300 in the current embodiment is formed so that the second organic layer (not illustrated) on the substrate 310 includes the first member (not illustrated) and the second member (not illustrated), so that a durability of the substrate 310 may improve.

FIGS. 10A through 10E are diagrams sequentially illustrating a method of manufacturing a display apparatus according to an embodiment of the present invention.

Specifically, FIGS. 10A through 10E illustrate a method of manufacturing the display apparatus 100 of FIG. 1. However, this is only an example, and the manufacturing method in the present invention may also be applied to the display apparatus 200 or 300 in another embodiment described above.

Figure 10A:
FIGS. 10A through 10E are diagrams sequentially illustrating a method of manufacturing the display apparatus according to an embodiment of the present invention.

First, referring to FIG. 10A, a carrier member 10 is prepared. The carrier member 10 may be formed by using various suitable materials, for example, a glass or silicone material. Desirably, the carrier member 10 may be formed of a rigid material.

Figure 10B:
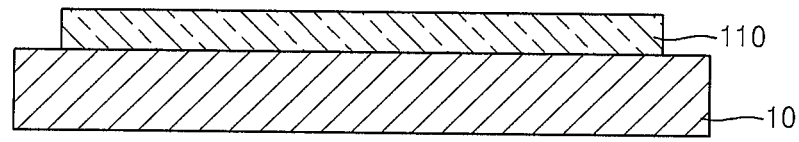

Then, referring to FIG. 10B, the substrate 110 is attached to the carrier member 10. As illustrated in the drawing, desirably, the carrier member 10 may be larger than or at least of the same size as the substrate 110. Though not illustrated, the carrier member 10 and the substrate 110 may be bonded to each other by using an adhesive agent or an double-sided adhesive tape. In such a case, heat or pressure may be used so that the carrier member 10 and the substrate 110 may be adhered to each other without a bubble.

As described above, the substrate 110 is formed by sequentially stacking the first organic layer (not illustrated), the first inorganic layer (not illustrated), the second organic layer (not illustrated), and the second inorganic layer. At least the second organic layer (not illustrated) is formed to include the first member (not illustrated) and the second member (not illustrated).

Figure 10C:
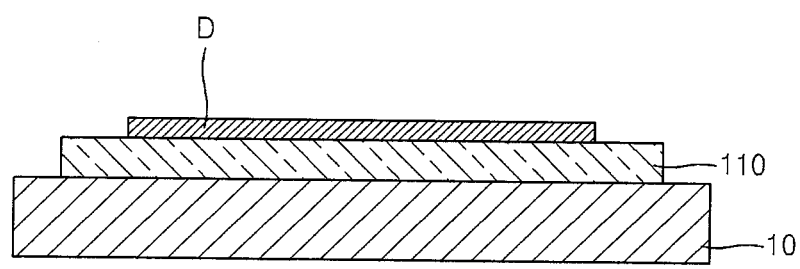

Then, referring to FIG. 10C, the display unit D is formed on the substrate 110. One of the structures shown in FIGS. 3 through 6 may be applied as the display unit D.

Figure 10D:
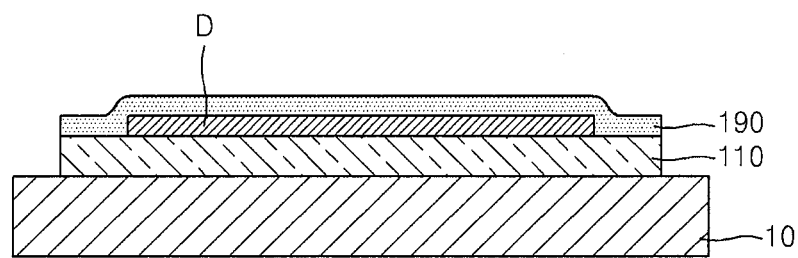
Figure 10E:
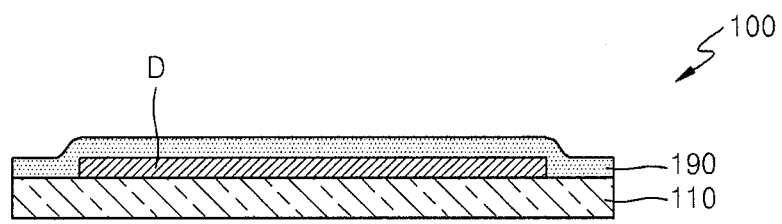

Then, referring to FIG. 10D, the encapsulation unit 190 is formed on the display unit D. Then, as illustrated in FIG. 10E, the carrier member 10 is removed, and thus, the display apparatus 100 is finally (eventually) completed.

In the current embodiment, the display apparatus 100 is manufactured so that the second organic layer (not illustrated) includes the first member (not illustrated) and the second member (not illustrated). Thus, a durability of the entire substrate 110 which includes the second organic layer (not illustrated) is effectively (easily) improved.

A display apparatus and a method of manufacturing the same, according to embodiments of the present invention, may effectively (easily) improve a durability.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A display apparatus comprising:
a substrate comprising a plurality of organic layers and a plurality of inorganic layers;
a display unit on the substrate; and
an encapsulation unit on the display,
wherein the plurality of organic layers and the plurality of inorganic layers comprise a first organic layer, a first inorganic layer, a second organic layer, and a second inorganic layer that are sequentially stacked, and
wherein an interfacial adhesion strength of the second organic layer to adjacent layers is higher than an interfacial adhesion strength of the first organic layer to adjacent layers.

2. The display apparatus of claim 1, wherein the second organic layer comprises a first member and a second member.

3. The display apparatus of claim 2, wherein the first member contains a polymer material.

4. The display apparatus of claim 2, wherein the first member contains polyimide (PI).

5. The display apparatus of claim 2, wherein the second member contains a reactive silicone material which comprises a material in an epoxy group and silicone.

6. The display apparatus of claim 5, wherein the first and second members are mixed together in a region comprising a surface of the second organic layer that faces the display unit.

7. The display apparatus of claim 2, wherein the first and second members are formed of the same material and have a different height from each other.

8. The display apparatus of claim 7, wherein the first and second members are not formed as one body and are formed to be separated from each other.

9. The display apparatus of claim 7, wherein an upper surface of the second organic layer, which comprises the first and second members, is formed to have an embossed surface.

10. The display apparatus of claim 2, wherein an upper surface of the first and second members contacts the second inorganic layer.

11. The display apparatus of claim 1, wherein the encapsulation unit comprises one or more organic or inorganic layers.

12. The display apparatus of claim 1, further comprising a sealing member that bonds the substrate and the encapsulation unit to each other.

13. The display apparatus of claim 1, wherein the display unit comprises a first electrode, a second electrode, and an intermediate layer between the first electrode and the second electrode and comprises an emissive layer.

14. The display apparatus of claim 13, further comprising a thin-film transistor (TFT) that is electrically connected to the first electrode and comprises an active layer, a gate electrode, a source electrode, and a drain electrode.

15. A method of manufacturing a display apparatus, the method comprising:
preparing a substrate comprising a plurality of organic layers and a plurality of inorganic layers;
forming a display unit on the substrate; and
forming an encapsulation unit on the display unit,
wherein the plurality of organic layers and the plurality of inorganic layers comprise a first organic layer, a first inorganic layer, a second organic layer, and a second inorganic layer that are sequentially stacked, and
wherein an interfacial adhesion strength of the second organic layer to adjacent layers is higher than an interfacial adhesion strength of the first organic layer to adjacent layers.

16. The method of claim 15, wherein the second organic layer is formed to comprise a first member and a second member.

17. The method of claim 16, wherein the forming of the second organic layer comprises adding a reactive silicone, which comprises a material in an epoxy group and silicone to form the second member, to a polymer material to form the first member, and applying, and then, hardening the polymer material with the reactive silicone added to the polymer material on the first inorganic layer.

18. The method of claim 16, wherein the first member and the second member are formed to have a different height and by using the same material.

19. The method of claim 18, wherein the first member and the second member are formed by using an ink-jet printing method or an offset printing method.

20. The method of claim 15, wherein the preparing of the substrate comprises disposing the substrate to a base member which is larger than or at least of the same size as the substrate, and
wherein the base member is removed before the display apparatus is manufactured.

* * * * *